(12) United States Patent
Fu et al.

(10) Patent No.: US 10,777,252 B2
(45) Date of Patent: Sep. 15, 2020

(54) SYSTEM AND METHOD FOR PERFORMING PER-BANK MEMORY REFRESH

(71) Applicant: Apple Inc., Cupertino, CA (US)

(72) Inventors: Peter Fu, Saratoga, CA (US); Gregory S. Mathews, Saratoga, CA (US); Kai Lun Hsuing, Fremont, CA (US); Shane J. Keil, San Jose, CA (US)

(73) Assignee: Apple Inc., Cupertino, CA (US)

( * ) Notice: Subject to any disclaimer, the term of this patent is extended or adjusted under 35 U.S.C. 154(b) by 72 days.

(21) Appl. No.: 16/109,720

(22) Filed: Aug. 22, 2018

(65) Prior Publication Data

US 2020/0066328 A1 Feb. 27, 2020

(51) Int. Cl.
*G06F 13/00* (2006.01)
*G11C 11/406* (2006.01)
*G06F 13/16* (2006.01)
*G06F 13/10* (2006.01)
*G06F 13/12* (2006.01)

(52) U.S. Cl.
CPC ........ *G11C 11/40603* (2013.01); *G06F 13/10* (2013.01); *G06F 13/12* (2013.01); *G06F 13/16* (2013.01); *G06F 13/161* (2013.01); *G11C 11/40618* (2013.01); *G06F 13/1636* (2013.01)

(58) Field of Classification Search
None
See application file for complete search history.

(56) References Cited

U.S. PATENT DOCUMENTS

| 2011/0161579 | A1 | 6/2011 | Walker |
| 2013/0080694 | A1 | 3/2013 | Iyer et al. |
| 2016/0180920 | A1 | 6/2016 | Proebsting |
| 2017/0062038 | A1 | 3/2017 | Doo et al. |

*Primary Examiner* — Midys Rojas
(74) *Attorney, Agent, or Firm* — Kowert, Hood, Munyon, Rankin & Goetzel, P.C.; Erik A. Heter

(57) ABSTRACT

A method and apparatus for performing opportunistic refreshes of memory banks is disclosed. Refresh circuitry in a memory controller performs a refresh on each bank of a multi-bank memory at least once during a given refresh interval. At the beginning of an interval, memory banks for which there are no pending transactions (e.g., reads or writes) may be refreshed. During a first portion of the interval, refresh may be skipped for memory banks for which transactions are pending. In a second portion of the interval, refreshes are performed on memory banks that have not been refreshed during the interval, which may cause some memory transactions to be delayed.

20 Claims, 6 Drawing Sheets

SYSTEM AND METHOD FOR PERFORMING PER-BANK MEMORY REFRESH

BACKGROUND

Technical Field

This disclosure is directed to computer systems, and more particularly, to memory subsystems.

Description of the Related Art

Memory subsystems used in many computer system include a memory controller coupled to a dynamic random access memory (DRAM). The memory controller controls traffic to and from (or writes and reads, respectively) the DRAM. The memory controller is typically coupled to other agents within the computer system, including processors/processor cores, graphics processors, I/O circuitry, and so forth. Memory controllers may include various units coupled to the memory, such as an I/O buffer, circuitry for conveying data strobe signals, and so on. Many memory controllers also include a physical layer, sometimes referred to as a PHY.

DRAMs used in many computer systems are implemented using high-speed memory chips. These memory chips can be organized into a number of different banks. Another characteristic of DRAMS is that they are volatile, meaning the data stored therein is lost upon removal of power. Furthermore, since DRAMs store data as a charge on a small capacitor, leakage can cause the data to be lost even without removing power. Accordingly, DRAM memory chips are periodically refreshed during operation. A refresh includes reading the data stored in the DRAM and writing it back into the same locations. When a memory is divided into banks, a refresh may be performed on a per-bank basis, or all banks may be refreshed concurrently.

SUMMARY

A method and apparatus for performing opportunistic refreshes of memory banks is disclosed. In one embodiment, refresh circuitry performs a refresh on each bank of a multi-bank memory at least once during a given refresh interval. At the beginning of an interval, memory banks for which there are no pending transactions (e.g., reads or writes) may be refreshed. During a first portion of the interval, refresh may be skipped for memory banks for which transactions are pending. In a second portion of the interval, refreshes are performed on memory banks that have not been refreshed during the interval, which may cause some memory transactions to be delayed.

In one embodiment, a memory subsystem includes a memory and a memory controller coupled thereto. The memory controller includes refresh circuitry configured to cause refreshes to be performed for each of a plurality of memory banks. The refresh circuitry includes a scoreboard used to track which ones of the banks of memory have been refreshed during a current refresh interval. The refresh circuitry also includes at least one time used to track an amount of time elapsed during the current refresh interval. When a predetermined amount of time has elapsed (indicating that the first portion of the current interval has completed), the refresh circuitry may, when operating in a first mode, discontinue performing opportunistic refreshes of the memory banks and begin forcing refreshes to be performed on each of the memory banks that has not otherwise been refreshed during the current interval.

BRIEF DESCRIPTION OF THE DRAWINGS

The following detailed description makes reference to the accompanying drawings, which are now briefly described.

Figure 1:
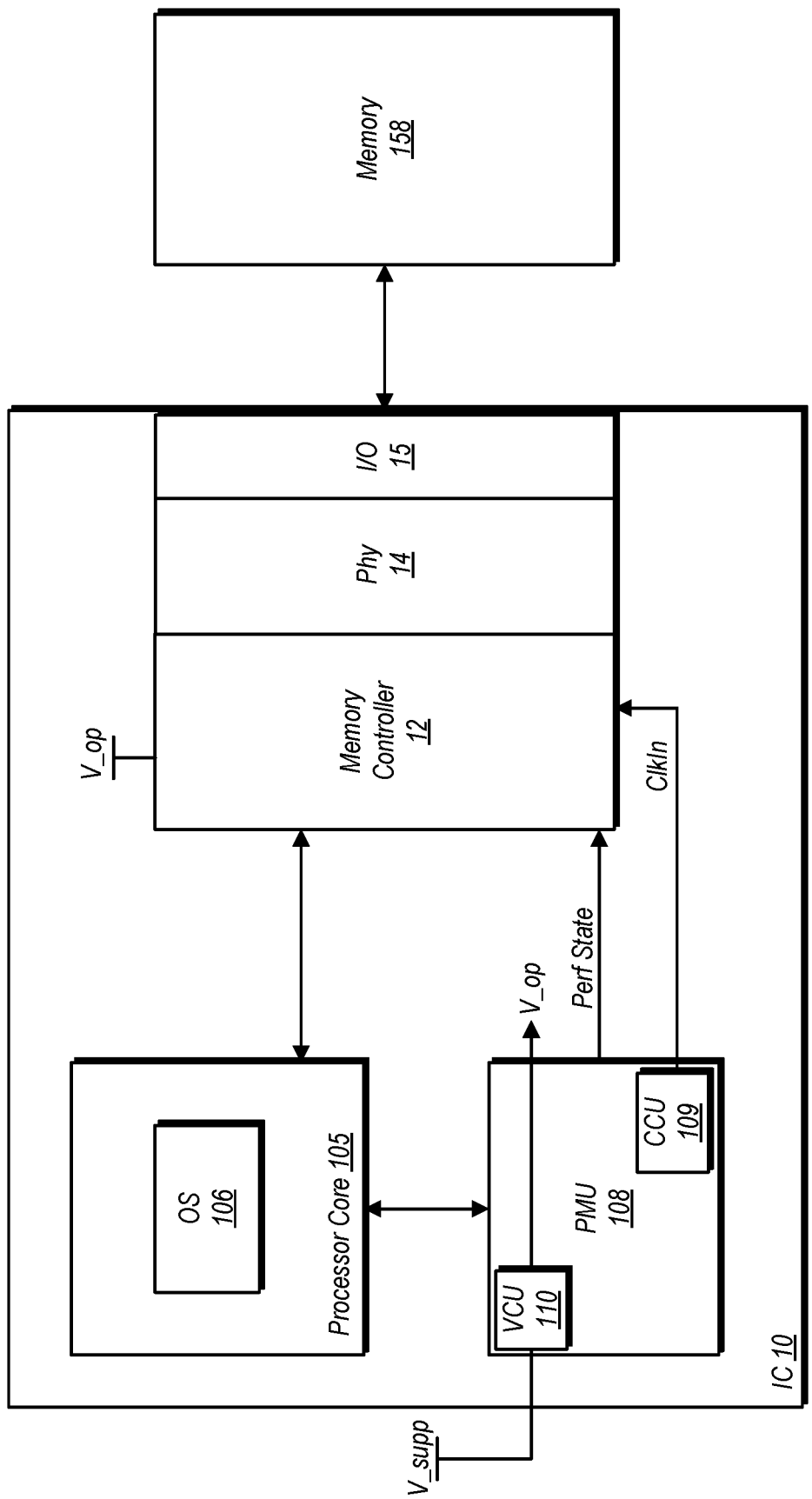
FIG. 1 is a block diagram of one embodiment of a system including a memory controller and a memory.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element.

Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 106. The instructions of OS 106 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 106 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and/or operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both. In addition to performance state changes, PMU 108 may also put into effect clock gating and/or power gating when various functional units and/or subsystems are idle. For example, if memory controller 12 is idle for a significant amount of time, PMU 108 may place it into a power gated state (i.e. power is removed therefrom), or alternatively, a clock gated state (i.e. a clock signal is inhibited from being provided thereto).

Memory controller 12, which includes physical layer (PHY) 14 and I/O circuitry 15, provides an interface between processor core 105 and memory 158. Although not explicitly shown, IC 10 may also include one or more units of interface circuitry that are also coupled to memory controller 12 and further coupled to other devices (e.g., peripherals). Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending performance state change to perform certain actions. These actions can, in some cases affect refresh operations in the memory, as is discussed below.

Figure 2:
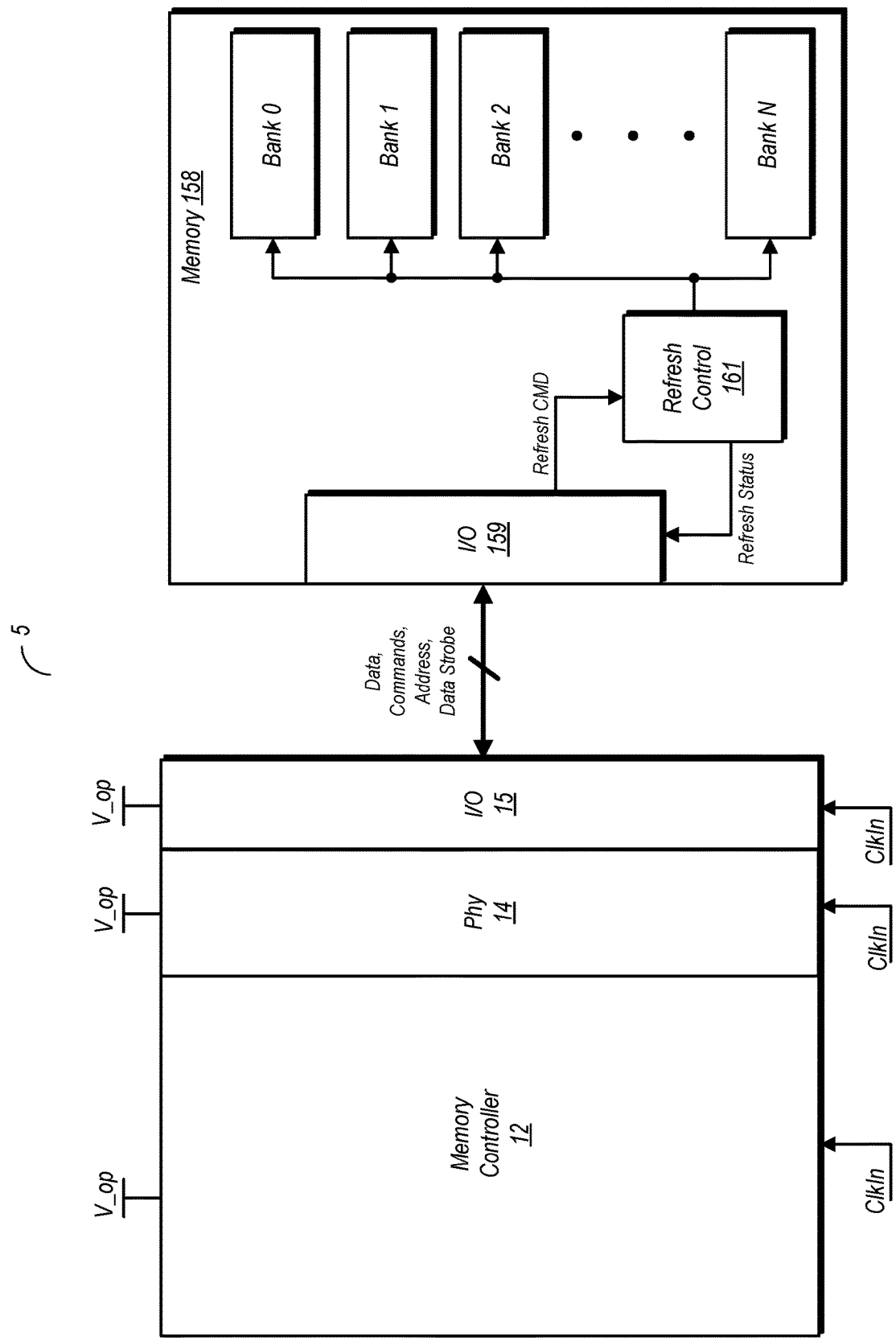
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 and an I/O unit 15, which collectively are used for interfacing with memory 158.

As previously noted, memory 158 is a DRAM, and includes a number of different memory banks (Bank 0 to Bank N) which provide the storage locations for information to be stored in memory. Each bank may be a separate memory chip in some embodiments, while other embodiments may implement multiple banks on a single memory chip. Generally speaking, the organization of the actual storage locations in terms of banks and memory chips may be any suitable arrangement for the particular application.

Memory 158 also includes an I/O unit 159, which implements circuits for various I/O functions. Among the circuits includes included in I/O unit 159 are address decoders, transmitters (for transmitting data back to memory controller 12), receivers (for receiving data from memory controller 12), and so on.

Since the various banks of memory 158 implement a DRAM, refreshes are periodically performed. Memory 158 in the embodiment shown thus includes refresh control circuit 161, which controls various aspects of performing various types of refreshes. The types of refreshes include per-bank refreshes and all-bank refreshes. When performing a per-bank refresh, individual ones of the banks are refreshed, one at a time. In contrast, performing an all-bank refresh includes refreshing all banks of memory 158 concurrently (or effectively, simultaneously). During performance of a per-bank refresh, only the bank currently being refreshed is unavailable for memory transactions. In some cases, transactions can be delayed if a bank is about to be the next bank refreshed, although it is also possible that the refresh of a given bank can be delayed in order to satisfy a memory transaction. In either case, the general availability of memory 158 during an all-bank refresh may extend to each bank that is not currently being refreshed. In contrast, the entirety of memory 158 is unavailable for read/write transactions during an all-bank refresh.

Refresh control circuit 161 can periodically initiate a refresh (without intervention of another agent in the system) or can initiate a refresh responsive to receiving a refresh command (e.g., from circuitry within memory controller 12). Furthermore, refresh control circuit 161 is arranged to report the status of a refresh that is underway. For example, if performing a per-bank refresh, refresh control circuit 161 may provide information indicating which bank is currently being refreshed, which banks have completed the refresh, and which bank is the next one to be refreshed, if known. This information may be conveyed back to memory controller 12, where it can be used to manage read/write transactions, e.g., re-ordering some transactions, if possible, to utilize banks that are available.

In one embodiment, per-bank refreshes can be performed on an opportunistic basis. As discussed in further detail below, memory controller 12 includes a refresh circuit that ensures each bank is refreshed at least once during each of a number of recurring refresh intervals. Each refresh interval may be subdivided into a skip interval followed by a force interval. During the skip interval, banks of memory may be refreshed based on availability, e.g., the absence of any transactions involving those bank. For banks that have transactions pending, refresh may be skipped during the skip interval, or performed after the transactions have been completed. During the force interval, banks of memory that were not refreshed during the skip interval are refreshed, with any pending transactions involving those banks delayed until refresh is completed. Generally speaking, refreshes are performed opportunistically during the skip interval (with transactions prioritized over refresh), while refreshes are prioritized over transactions during the force interval in order to ensure that all banks are refreshed during the overall refresh interval.

Figure 3:
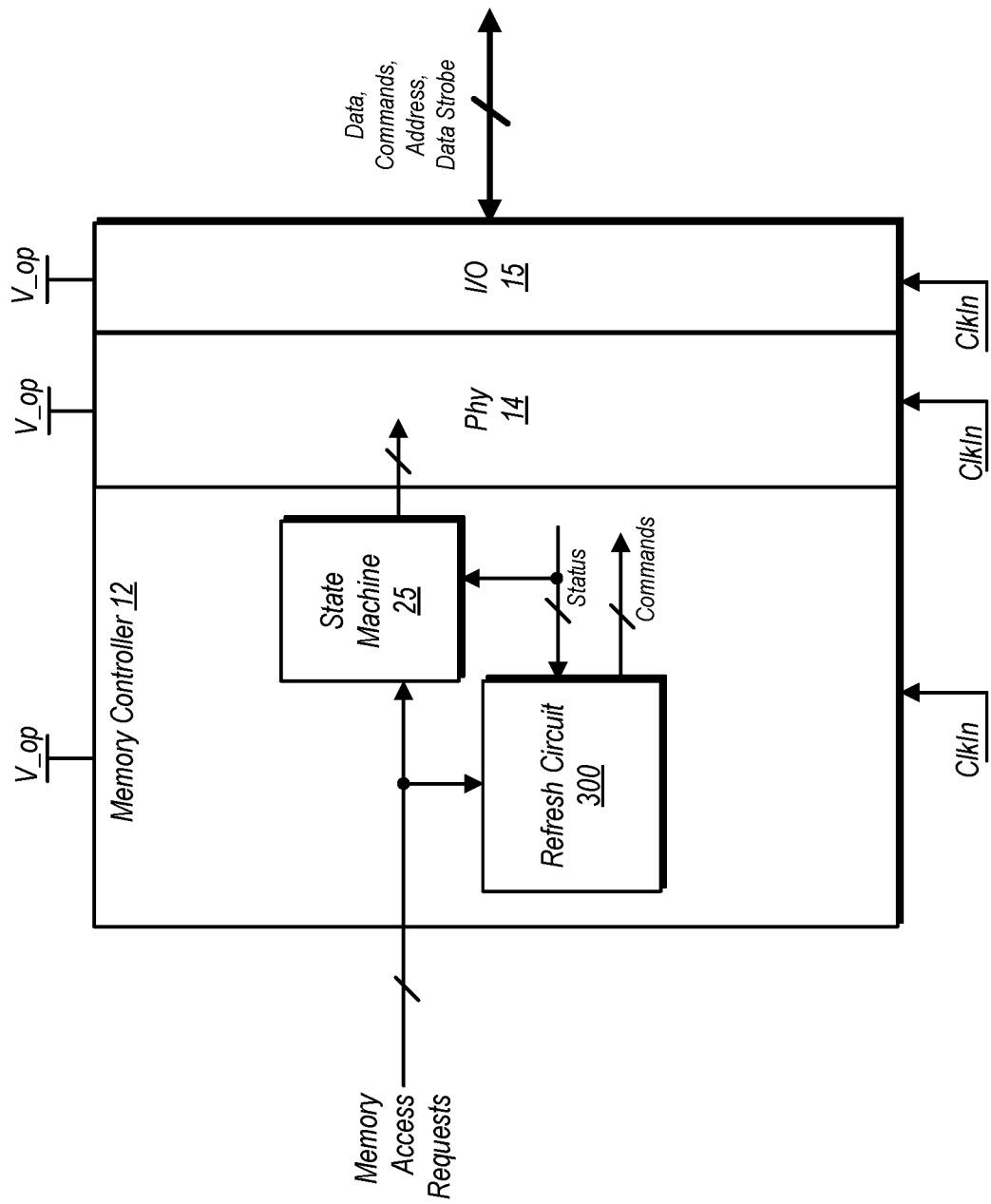
FIG. 3 is a block diagram illustrating further details of one embodiment of a memory controller.

FIG. 3 is a block diagram further illustrating one embodiment of a memory controller. In the embodiment shown, memory controller 12 includes a physical layer 14 and an I/O unit 15. Each portion of memory controller 12 is coupled to receive a supply voltage, V_op, and a clock signal, ClkIn. Although not explicitly shown, each of these portions of memory controller 12 may include internal circuitry that allows for power gating and clock gating of their respectively coupled circuits. Furthermore, the operating voltage received by each may be adjusted in accordance with a performance state, by, e.g., PMU 108 of FIG. 1. Furthermore, it is possible and contemplated that the operating voltage received by each portion of memory controller 12 is independently controllable with respect to that received by other portions thereof.

Memory controller 12 in the embodiment shown includes a state machine 25. State machine 25 in the embodiment shown includes logic circuitry for carrying out certain control functions in memory controller 12. These functions include carrying our read and write operations, and may also include supporting some calibration operations. Among the inputs to state machine 25 are memory access requests, performance state change notifications (or requests), and status information from other units in the memory subsystem.

Memory controller 12 also includes a refresh circuit 300, which performs functions to control refresh from the memory controller side of the memory subsystem. Refresh circuit 300 in the embodiment shown issues refresh commands that re conveyed to refresh control circuit 161 in the memory. Similarly, status information regarding refreshes is provided from refresh control circuit 161 of memory 158 to refresh circuit 300 as well as to state machine 25. Both state machine 25 and refresh circuit 300 are coupled to receive memory access requests. Refresh circuit 300 may use the information regarding access requests, along with access scheduling information from state machine 25, to determine when refreshes may be performed.

As noted above, the memory subsystem discussed herein may allow for the performing of opportunistic per-bank refreshes. Refresh circuit 300 may track intervals of time, referred to as refresh intervals, in which each of the banks of memory 158 are to be refreshed at least once. Using the information regarding requested memory accesses, along with transaction status information received from state machine 25 regarding scheduled memory accesses, refresh circuit 300 may issue refresh commands to memory 158 to cause refreshes to be performed. During a first portion of the refresh interval (which may be referred to as the skip interval), memory accesses may be prioritized over refreshes. Refreshes may be performed for memory banks for which no transaction (read or write) are pending. Meanwhile, during the skip interval, performing transactions is prioritized over performing refreshes. If a particular memory bank completes a transaction during the skip interval, and no other transactions are pending, refresh circuit 300 may issue a refresh command to cause that bank to be refreshed.

As second portion of the refresh interval is the force interval, which occurs subsequent to the skip interval. During the force interval, refreshes are prioritized over transactions. Any banks that have not been refreshed previously during the refresh interval are refreshed during the force interval. For banks to be refreshed during the force interval, transactions involving the same are delayed until the refresh is completed. Since multiple banks may be refreshed during the force interval, refresh circuit 300 may arbitrate between competing banks to schedule the refreshes such that all may be completed prior to completion of the refresh interval. Accordingly, any banks for which a refresh would consume more time to complete can be scheduled to be performed before refreshes of banks that would be completed in a shorter amount of time.

Thus, refresh circuit may operate in multiple modes. One of these modes may be the opportunistic refresh mode. Another mode in which refresh circuit 300 operates in may be referred to as the scheduled refresh mode, in which refreshes are prioritized and transactions are delayed, irrespective of an amount of time left within a given refresh interval. Within the scheduled refresh mode, refresh circuit 300 may operate in one of two different sub-modes, one in which all-bank refreshes are performed and another in which per-bank refreshes are performed in a scheduled sequence. In contrast to the opportunistic refresh mode, operation in either sub-mode of the scheduled refresh mode implies that refreshes are given priority over memory transactions throughout the refresh interval.

Figure 4:
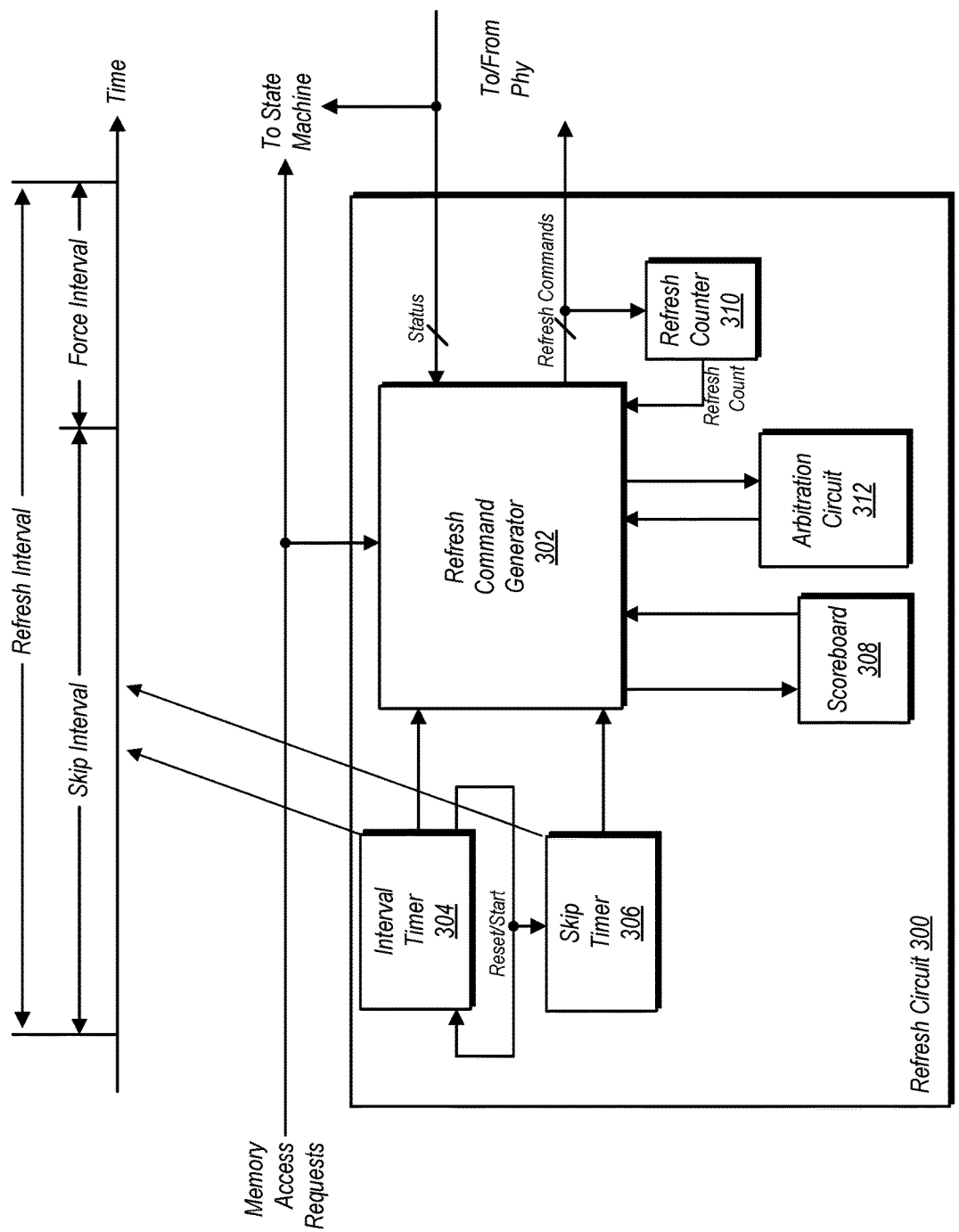
FIG. 4 is a block diagram illustrating one embodiment of a refresh circuit implemented in a memory controller.

FIG. 4 illustrates one embodiment of a refresh circuit in further detail. In the embodiment shown, refresh circuit 300 includes a refresh command generator 302, an interval timer 304, a skip timer 306, a scoreboard 308, an arbitration circuit 312, and a refresh counter 310.

Refresh command generator 302 in the embodiment shown may issue refresh commands that are conveyed to memory and cause refreshes to be performed. The refresh commands may include all bank refreshes (where all memory banks are concurrently refreshed) or per-bank refreshes (in which banks are individually refreshed). With regard to per-bank refreshes, refresh command generator 302 may cause the memory banks to be refreshed in a particular sequence, or may utilize the opportunistic refresh scheme discussed herein.

Interval timer 304 in the embodiment shown is used to time each of the refresh intervals. As previously noted, a refresh may be performed at least once one each bank within a given interval in order to, e.g., satisfy periodic refresh requirements. Accordingly, the interval timer may track the amount of time elapsed in a given interval, and through resets, may define the end of one refresh interval and the beginning of the next. During operation, refresh timer may run continuously in order to time successive refresh intervals.

It is noted that the refresh interval may vary with operating conditions. For example, if temperature increases, the refresh interval (along with the skip interval) may be adjusted accordingly to accommodate the changing conditions.

Skip timer 306 in the embodiment shown is used to time the skip interval. A graphic illustration of the overall refresh interval, along with the skip interval and the force interval is shown in FIG. 4 above the block diagram of refresh circuit 300. When refresh circuit 300 is operating to perform refreshes opportunistically, skip timer is activated and begins tracking the time elapsed in the skip interval at effectively the same time interval timer 304 begins a new interval. However, skip timer 306 completes prior to interval timer 304 completing its timing of the refresh interval. When skip timer 306 expires, an indication is provided to refresh command generator 302 that the skip interval has elapsed, and thus, by default, refresh circuit 300 is now operating in the force interval portion of the refresh interval. At this point, refresh command generator 302 responds by prioritizing refreshes over transactions in order to ensure the refresh of any banks not previously refreshed during the interval. It is noted, however, that banks that were opportunistically refreshed during the skip interval may be available for read/write transactions at this time.

It is noted that after the skip interval expires, skip timer 306 remains inactive (save for providing the indication to refresh command generator 302) until the end of the refresh interval. Responsive to the expiration of the refresh interval, interval timer 304 generates a reset signal. The assertion of this reset signal causes the resetting of both interval timer 304 and skip timer 306, and begins the next refresh interval in accordance with the illustration of the same shown in FIG. 4.

Refresh circuit 300 in the embodiment shown includes a refresh counter 310 and a scoreboard 308. The refresh counter 310 is used to track the number of currently pending refresh commands during a given refresh interval, and provide a corresponding refresh count back to refresh command generator 302. This counter may be reset at the beginning of a new refresh interval. Meanwhile, scoreboard 308 in the embodiment shown tracks which particular ones of the banks has been refreshed during a given refresh interval. Refresh command generator 302 may use the information provided by refresh counter 310 and scoreboard 308 to determine the number of banks to be refreshed in the interval as well as which specific ones need to be refreshed. Refresh command generator may further update scoreboard 308 throughout the refresh interval as banks are refreshed. In some embodiments, the functions of scoreboard 308 and refresh counter 310 may be combined into a single unit of circuitry.

Refresh circuit 300 in the embodiment shown also includes an arbitration circuit 312. During operation, arbitration circuit 312 may arbitrate among the banks for refresh priority. This is particularly true during the force interval, when time is limited to finish refreshing of remaining banks (i.e. un-refreshed during the refresh interval). Arbitration circuit 312 may store information regarding a time required to refresh each of the banks, as some banks may require more time to refresh than others for various reasons. Accordingly, arbitration circuit 312 may allow refresh circuit 300 to set refresh order so that any remaining banks may be refreshed during the force interval.

In addition to setting the refresh order of banks during the refresh interval, arbitration circuit 312 may also determine transactions that can be scheduled and performed during the force interval. Generally speaking, memory transactions may be conducted when such transactions do not block or otherwise interfere with those refreshes that must be completed during the force interval. For example, memory banks that were refreshed during the skip interval may be available for normal memory transactions during the force interval if such transactions do not interfere with the refreshing of other banks that were not refreshed during the skip interval. Transactions may also be initiated on banks that have completed their respective refreshes during the force interval, assuming such transactions to not interfere with other refreshes to be conducted during the force interval.

Various embodiments of the refresh circuit 300 and memory controllers implementing may provide certain advantages. For example, memory availability may be enhanced by allowing refreshes to be skipped for at least some of the banks, while opportunistically refreshing others. In general, the various method and system embodiments discussed herein may allow for more flexibility in the operation of a memory subsystem, which can lead to overall performance gains.

Figure 5:
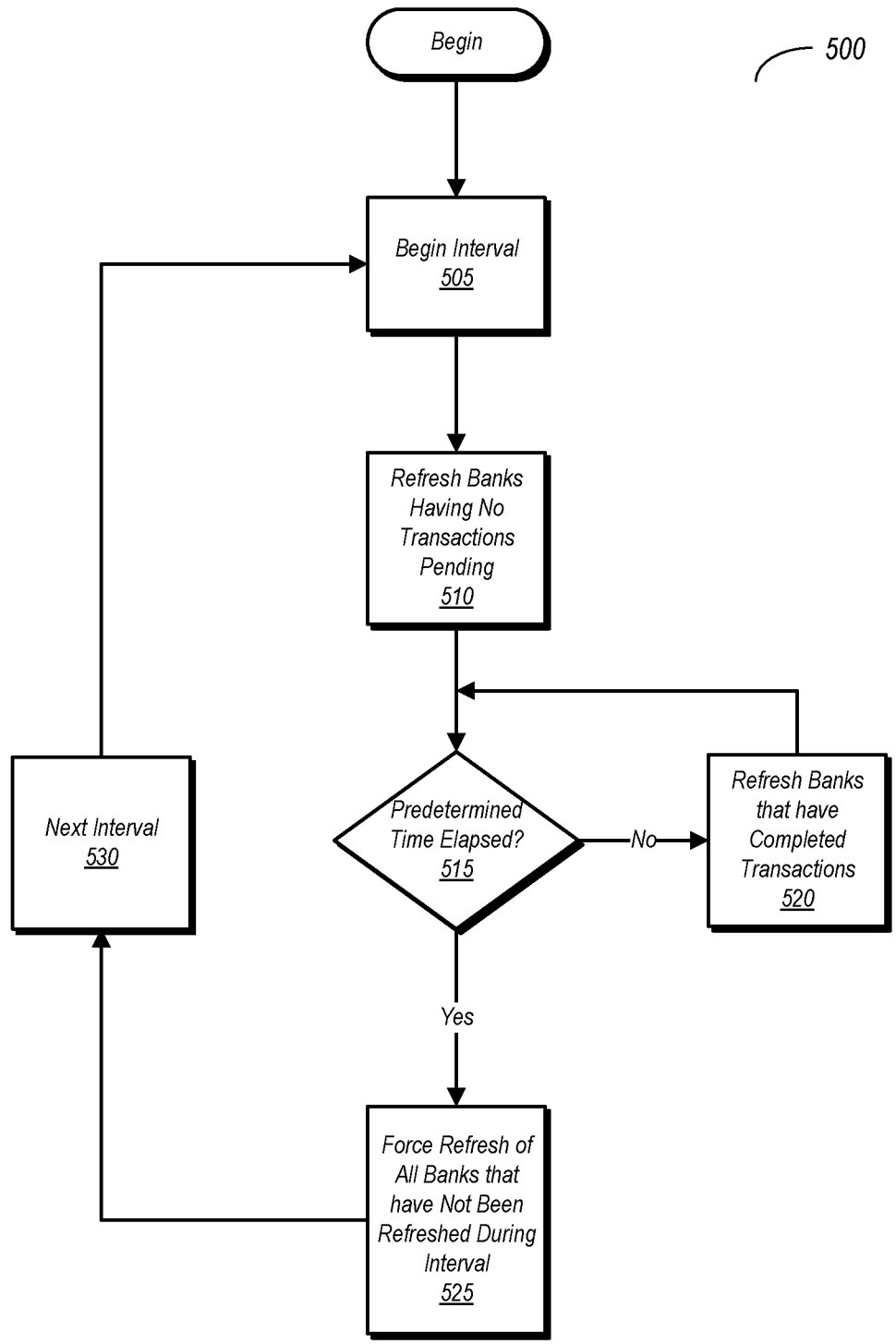
FIG. 5 is a flow diagram of one embodiment of a method for performing memory refreshes on a per-bank basis.

FIG. 5 is a flow diagram of one embodiment of a method for operating a memory subsystem in accordance with the disclosure. Method 500 may be executed by any of the various hardware embodiments discussed above, as well as hardware embodiments not explicitly disclosed herein. Such hardware embodiments may thus fall within the scope of this disclosure.

Method 500 begins with the beginning of a refresh interval (block 505). The first portion of the refresh interval may be referred to as a skip interval. During the skip interval, memory banks may be refreshed on a per-bank basis and in an opportunistic manner. Accordingly, when a new refresh interval begins, memory banks having no pending transactions may be refreshed (block 510). These banks may be refreshed concurrently or in a sequence determined by, e.g., a refresh circuit such as that discussed above. If a predetermined time has not elapsed (block 515, no), indicating that the refresh interval is in the skip interval portion, additional banks may be refreshed as their transactions complete (block 520). Thus, during the skip interval, refreshes may be initiated for memory banks having no pending transactions at the beginning as well as those that complete transactions prior to the elapsing of the skip interval.

If the predetermined amount of time has elapsed (block 515, yes), indicating that the skip interval has completed and the force interval has begun, refreshes may be forced upon memory banks that have not otherwise been refreshed during the current refresh interval (block 525). Thus, whereas transactions are prioritized over refreshes during the skip interval, during the force interval, refreshes are prioritized over transactions. In this manner, all banks may be refreshed within the refresh interval while prioritizing memory transactions. At the end of the refresh interval, method 500 progresses to the next interval (block 530), and the method repeats.

Figure 6:
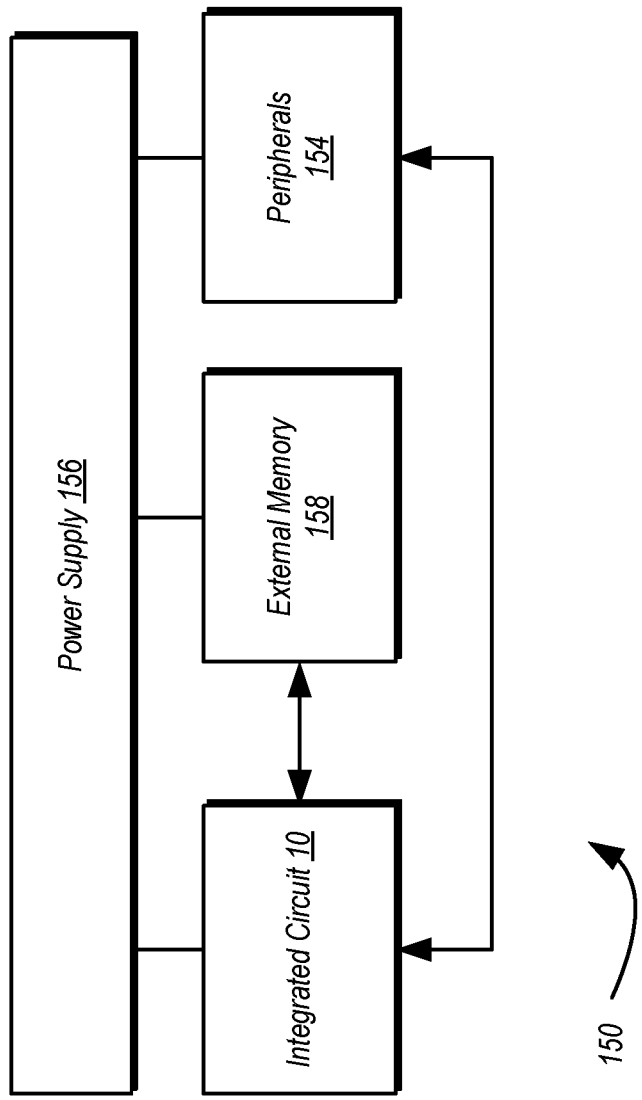
FIG. 6 is a block diagram of one embodiment of an example system.

FIG. 6 is a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a memory, wherein the memory is subdivided into a plurality of banks; and
   a memory controller coupled to the memory, wherein the memory controller includes a refresh circuit configured to cause the plurality of banks to be refreshed within ones of a number of recurring intervals of time, and wherein the refresh circuit, when operating in a first mode, is further configured to:
   cause, during a first sub-interval of a particular interval, a refresh to be performed for ones of the plurality of banks for which no transactions are pending, but not for ones of the plurality of banks for which transactions are pending; and
   cause a refresh to be performed, during a second sub-interval of the particular interval that is subsequent to the first sub-interval, for ones of the plurality of banks that have not previously been refreshed during the particular interval.

2. The apparatus as recited in claim 1, wherein the refresh circuit includes a timer configure to track an amount of time remaining in a current one of the recurring intervals, and further configured to determine when the first sub-interval has completed.

3. The apparatus as recited in claim 1, wherein the refresh circuit is further configured to, during the second sub-interval, select an order in which ones of the plurality of banks are to be refreshed based on an amount of time required to refresh the ones of the plurality of banks.

4. The apparatus as recited in claim 1, wherein responsive to determining that each of the plurality of banks has pending transactions at a beginning of a current interval, the refresh circuit is configured to cause banks having a fewest number of pending transactions to be refreshed first.

5. The apparatus as recited in claim 1, wherein the refresh circuit includes a scoreboard configured to track which ones of the plurality of banks have been refreshed within a current interval.

6. The apparatus as recited in claim 1, wherein the refresh circuit is further configured to, during the first sub-interval, cause a refresh to be performed on ones of the plurality of banks responsive to those ones of the plurality of banks completing transactions.

7. The apparatus as recited in claim 1, wherein the refresh circuit includes an arbitration circuit configured to determine an order in which ones of the plurality of banks are to be refreshed.

8. The apparatus as recited in claim 1, wherein the refresh circuit includes a refresh counter configured to track a number of pending refresh commands.

9. The apparatus as recited in claim 1, wherein the refresh circuit is further configured to operate in a second mode, wherein during operation in the second mode, the refresh circuit is configured to delay transactions between the memory controller and the memory irrespective of an amount of time remaining in an interval during which operation in the second mode occurs.

10. A method comprising:
   performing, during operation of a refresh circuit in a first mode, a refresh of a first subset of a plurality of memory banks during a first sub-interval of a refresh interval and responsive to determining that the first subset of the plurality of memory banks have no pending memory transactions;
   skipping refresh for a second subset of the plurality of memory banks during the first sub-interval of the refresh interval and elapsing of a predetermined time thereafter based on determining that memory banks of the second subset have one or more pending transactions; and
   causing, during a second sub-interval of the refresh interval, a refresh of remaining ones of the plurality of memory banks that have not been refreshed during the refresh interval.

11. The method as recited in claim 10, further comprising refreshing particular ones of the memory banks within the first sub-interval responsive to determining that pending memory transactions involving the particular ones of the memory banks have been completed.

12. The method as recited in claim 10, further comprising the refresh circuit maintaining a record of which ones of the plurality of banks has been refreshed during the refresh interval.

13. The method as recited in claim 10, further comprising an arbitration circuit arbitrating an order in which banks of the plurality of banks are to be refreshed.

14. The method as recited in claim 10, further comprising the refresh circuit operating in a second mode, wherein operating in the second mode includes the refresh circuit delaying transactions to particular ones of the memory banks while causing refreshes to be performed for each of the plurality of memory banks.

15. A system comprising:
   a memory, wherein the memory is subdivided into a plurality of banks; and
   a memory controller coupled to the memory, wherein the memory controller includes a refresh circuit configured to cause the plurality of banks to be refreshed within ones of a number of recurring intervals of time, and wherein the refresh circuit, when operating in a first mode, is further configured to:
      during operation in a first sub-interval of a given interval, prioritize memory transactions over performing refreshes, wherein prioritizing memory transactions comprises performing refreshes for ones of the plurality of banks for which no transactions are pending and delaying refresh for ones of the plurality of banks for which transactions are pending; and
      during operation during a second sub-interval of the given interval following the first sub-interval, cause a refresh to be performed for ones of the banks for which a refresh has not been performed during the given interval.

16. The system as recited in claim 15, wherein the refresh circuit includes a timer configured to determine when the first sub-interval has ended and the second sub-interval has begun.

17. The system as recited in claim 15, wherein the refresh circuit is configured to, during the second sub-interval, prioritize ones of the plurality of banks for performing a refresh based on an amount of time required to refresh the ones of the plurality of banks.

18. The system as recited in claim 15, wherein the refresh circuit includes a scoreboard configured to track which ones of the plurality of banks have been refreshed during the given interval.

19. The system as recited in claim 15, wherein the refresh circuit is configured to, during the first sub-interval, cause a refresh to be performed on ones of the plurality of banks responsive to those ones of the plurality of banks completing transactions.

20. The system as recited in claim 15, wherein the refresh circuit is further configured to operate in a second mode, wherein during operation in the second mode, the refresh circuit is configured to delay transactions between the memory controller and the memory irrespective of an amount of time remaining in an interval during which operation in the second mode occurs.

* * * * *